United States Patent
Genard et al.

[11] Patent Number: 5,820,684
[45] Date of Patent: Oct. 13, 1998

[54] SUBSTRATE SUPPORT FOR AN EVAPORATION INSTALLATION

[75] Inventors: Dominique Genard, Pernay; Georges Pinsault, Tours, both of France

[73] Assignee: SGS-Thomson Microelectronics S.A., Gentilly, France

[21] Appl. No.: 818,126

[22] Filed: Mar. 14, 1997

[30] Foreign Application Priority Data

Mar. 15, 1996 [FR] France ................................... 96 03470

[51] Int. Cl.⁶ .................................................. C23C 16/00
[52] U.S. Cl. ............................ 118/728; 118/730; 118/503
[58] Field of Search ................................. 118/728, 730, 118/503

[56] References Cited

U.S. PATENT DOCUMENTS 4,971,676  11/1990  Doue ....................................... 118/503

FOREIGN PATENT DOCUMENTS 58-128724  8/1983  Japan ............................ H01L 21/203
04110466   4/1992  Japan ............................ H01J 37/317

*Primary Examiner*—Richard Bueker
*Attorney, Agent, or Firm*—Seed and Berry LLP

[57] ABSTRACT

The present invention relates to a concave substrate support for an evaporation installation, comprised of a substantially solid surface and provided with resilient clasps for holding substrates positioned against an inner surface of the support. The clasps are operable from an external surface of the support.

20 Claims, 3 Drawing Sheets

SUBSTRATE SUPPORT FOR AN EVAPORATION INSTALLATION

BACKGROUND OF THE INVENTION

1. Field of the Invention

The present invention relates to a substrate support of the type generally used in an installation for evaporating materials on substrates.

2. Discussion of the Related Art

FIG. 1 shows a conventional evaporation installation of the type to which the present invention applies. Such an installation is formed by a vacuum chamber 1 within which three supports S are generally arranged.

Each of the bell-shaped supports is formed by a concave surface having a circular shape, wherein generally circular openings 2 for receiving silicon wafers are provided. The wafer surfaces to be processed are directed away from the inside of the concave surface of the supports. In FIG. 1, only a few openings 2 of the supports S are shown, but all supports include openings along their entire surface.

Each support S is rotatably mounted at the end of a shaft A perpendicular to the support surface. The shafts A are supported by a common suspension frame 3, which is itself rotatably mounted on a vertical main shaft 4 which is supported by an upper wall 5 of chamber 1. Frame 3 supports arms P, which, in turn, support shafts A at the free ends. The rotating motion of frame 3 transmits, generally through bevel gears (not shown), a rotating motion to transmission shafts (not shown) contained in the arms P which transmit the rotating motion, by similar means, to the shafts A. The rotating motions of frame 3 and of the supports S are illustrated in FIG. 1 by arrows, respectively F1 and F2. The supports S are generally called "planet members" due to their eccentric respective motions. The internal surfaces of the supports are directed towards an evaporation source 6 contained within chamber 1.

An evaporation cycle consists of loading chamber 1 with supports S holding wafers to be processed, performing a vacuum pumping of the inside of chamber 1, heating the internal space of chamber 1, energizing evaporation source 6 in order to cause a deposition, cooling down and ventilating the chamber, and extracting the supports S. The rotating motions, transmitted to frame 3 and to the supports S, ensure a uniform deposition on the surfaces to be processed. The operation of such an installation is well known in the art.

The shafts A of the supports S are removably mounted on the arms P to enable the extraction of the supports S from chamber 1 in order to unload the processed wafers therefrom and to position the wafers to be processed thereon. During the wafer load/unload operations, the support generally rests upon a rotating plate which is rotated by the user to load or unload the wafers.

FIG. 2 shows, partially and in cross-sectional view, an example of a conventional support S at an opening 2 for receiving a silicon wafer 7. Each opening 2 has a peripheral shoulder 8 upon which rests the wafer 7, via its surface to be exposed. Wafer 7, positioned from the outside of the support, is held in place by means of a spring 9, and a guard 10 covering the entire rear surface of wafer 7. The function of guard 10 is to avoid the breaking of the wafer 7 by spring 9. The wafer 7 is generally very thin, measuring between 0.3 to 0.6 mm. Guard 10 also protects the external surface of wafer 7 to avoid contamination during the evaporation process. This is especially true if each of the two surfaces of the silicon wafer are receiving a deposition.

A disadvantage of the conventional support is that the shoulder 8 upon which the wafer circumference is resting creates a peripheral area of the wafer surface which is masked during evaporation. Due to the positioning tolerances of a wafer 7 in an opening 2, this area of the wafer which cannot be used generally has a width of 1 to 4 mm. The effective surface loss of wafer 7 is prejudicial to the efficiency of the production in terms of the number of chips likely to be processed. The proportion of the chip which is unserviceable, because it was not processed over its entire surface depends on the individual size of the chips which are formed on the wafer.

Another disadvantage of the conventional supports such as those described above is that the necessary use of a guard behind each wafer increases the loading and unloading time of a batch of wafers on a support.

Another disadvantage of a conventional support of this type is that spring 9 has to be disengaged from the opening by the user prior to the extraction or the positioning of guard 10 and wafer 7. Therefore, once the spring has been disengaged, for example by being rotated with respect to its anchor point 11 at the edge of opening 2, wafer 7 is not maintained in its housing during the positioning or the extraction of guard 10. The wafer thus risks falling out of its housing, especially due to the concave shape of support S. Moreover, even though shoulder 8 takes part in a proper positioning of wafer 7, if the wafer is smaller than the opening, the positioning of guard 10 and of spring 9 increases the chance of wafer breakage due to mispositioning.

FIG. 3 shows, schematically and in cross-sectional view, a second example of a means for holding wafers on a conventional support. For clarity, the wafers 7 and the guards 10 have not been shown in FIG. 3. All springs 9' are supported by rings 12 interconnected by rods 13. Each ring 12 supports several springs 9' distributed according to the position of the openings 2 of support S. A structure separate from support S is thus obtained, which includes all springs 9' and which is added onto support S and attached, for example, by screwing (not shown), to the latter once all wafers and all guards have been positioned.

Although such a structure avoids the individual handling of the springs, it has several disadvantages in addition to the same disadvantages as the first example of holding means illustrated in FIG. 2. First, it increases the general thickness of the support, which is prejudicial to the compactness of the general installation. Further, the support is made substantially heavier by the presence of such a structure. Moreover, since the user no longer handles the springs individually, the spring force is not controlled for each wafer positioning. Thus, the user may not notice that a spring is lame, and thus inefficient, which creates a risk that wafers may fall from the support when it is rotated in the chamber.

Another disadvantage common to the two examples of conventional holding means described hereabove is that the presence of openings 2 in the support requires that the latter be sufficiently thick, or reinforced, to have sufficient rigidity despite the openings 2. Generally, the supports are formed in stainless steel, with a thickness of 2.5 mm.

SUMMARY OF THE INVENTION

The present invention aims at overcoming the disadvantages of known supports by providing a substrate support for an evaporation procedure which minimizes the loss of effective surface of the processed substrates.

The present invention also aims at providing a support which minimizes all risks of a wafer breaking during the steps of loading, positioning and unloading a batch of wafers from the support.

The present invention also aims to provide a substrate support that simplifies the substrate positioning and unloading operations.

The present invention includes a concave substrate support for an evaporation installation comprised of a substantially solid surface and provided with a resilient means for holding substrates positioned against an inner surface of the support. The holding means are operable from an outer surface of the support.

According to an embodiment of the present invention, each holding means of a substrate is operable individually.

According to an embodiment of the present invention, each holding means is attached to the support from the outer surface and includes a tab extending through a port provided in the support near the location provided for a wafer, the tab being meant to bear against the edge of the substrate.

According to an embodiment of the present invention, the internal surface of the support is provided with at least one stop for cooperating with the resilient holding means. The stop is located substantially opposite to the port with respect to the center of the location.

According to an embodiment of the present invention, each location is defined by a recess of the internal surface of the support.

According to an embodiment of the present invention, each holding means is comprised of a hairpin spring, two branches of which are maintained outside the support. The first branch terminates, at its free end, by the tab extending through the port. The second branch provides a means for operating the spring from the outside of the support.

According to an embodiment of the present invention, each holding means is comprised of a leaf spring with two ends. The first end is attached to the external surface of the support and the second end supports the tab for bearing against the edge of a substrate.

According to an embodiment of the present invention, the tab includes an extension directed towards the outside of the support to provide a means for operating the spring from the outside of the support.

This invention applies to an evaporation installation for depositing metallic compounds on semiconductor components being manufactured on silicon wafers. A characteristic of the present invention is that the substrate support is substantially solid. Unlike the prior art, it does not have openings to position the substrates. Accordingly, the substrates are positioned on the support from its external surface.

An advantage of the present invention is that the substrate surface submitted for evaporation now corresponds to the entire substrate surface. Thus, for a deposition of metallic compounds on semiconductor wafers being manufactured on silicon wafers, the efficiency of the evaporation process in terms of the number of chips which can be processed is increased.

Another advantage of the present invention is that it eliminates the use of guards added onto the external surface of the wafers, which reduces the time required to load or unload a support with a batch of wafers.

These objects, characteristics and advantages as well as others of the present invention will be discussed in detail in the following non-limiting description of a specific embodiment in relation with the accompanying drawings.

DETAILED DESCRIPTION

The same components have been referred to by the same references in the different drawings. Similarly, the drawings are not to scale.

Figure 1:
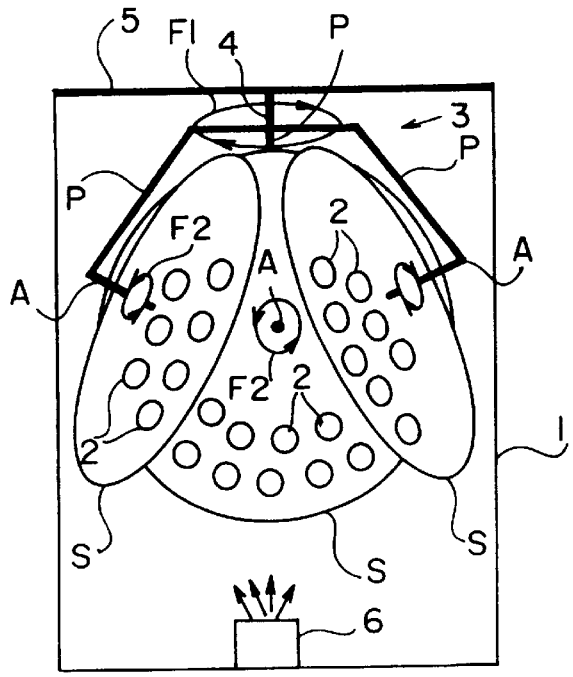
FIGS. 1, 2 and 3, previously described, show the state of the art and the problem to solve.
Figure 2:
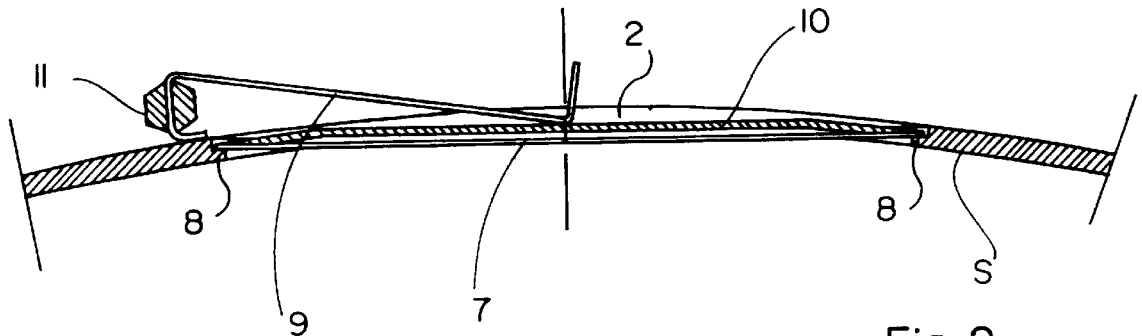
Figure 3:
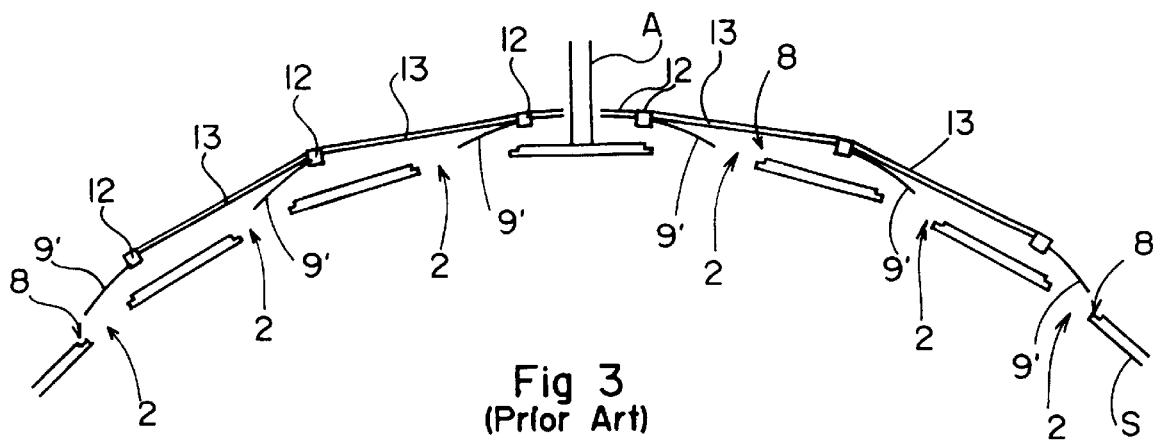
Figure 4:
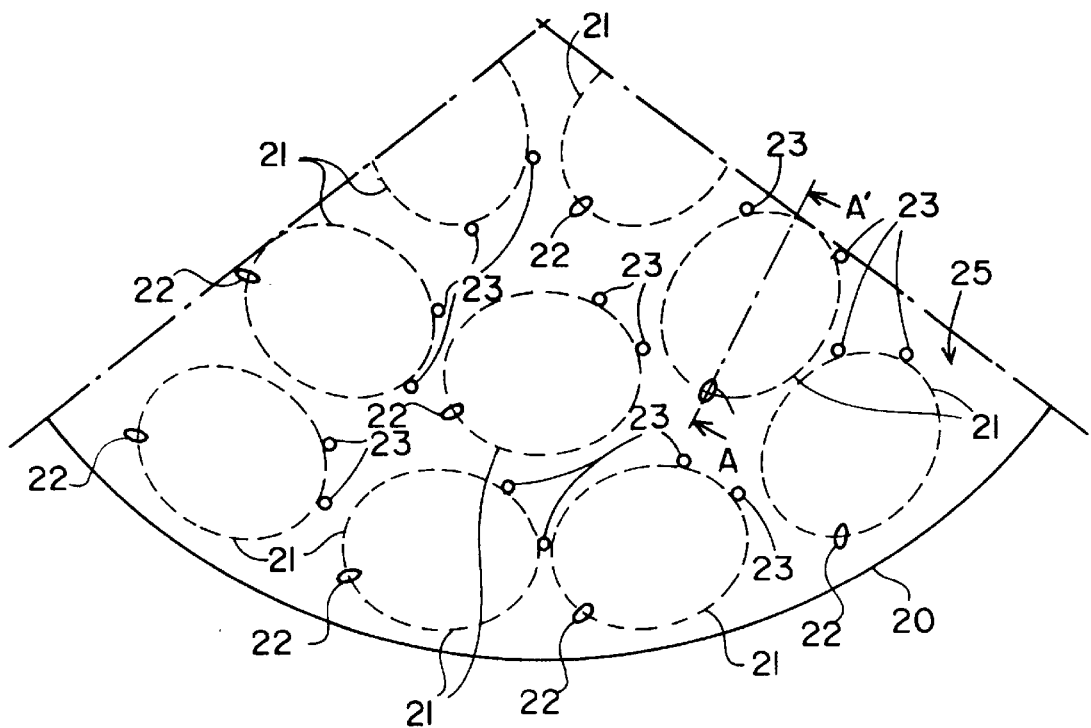
FIG. 4 partially shows, in an inside elevational view, an embodiment of a substrate support according to the present invention.

FIG. 4 illustrates, by a partial elevational view from the inside, an embodiment of a substrate support 20 according to the present invention. Bell-shaped support 20 is formed by a solid concave surface with a circular circumference, and having an inside surface 25 which is meant to receive silicon wafers. The wafer surfaces to be processed are directed away from the inside of the concave surface of the support 20.

In FIG. 4, the locations 21 of the wafers have been shown by circles in dotted lines, the flattened shape of the peripheral circles being due to the concave shape of support 20. According to the present invention, a port 22 having small dimensions with respect to the size of a wafer is made at the edge of each location 21 provided for a wafer. The ports 22 allow a resilient means to hold the wafer positioned in the location 21 to which the port 22 is associated. At least one lateral stop 23 is disposed diametrically opposite to the port 22 of each location 21. Preferably, at least two stops 23 are provided at the edge of location 21 opposite to port 22.

Figure 5:
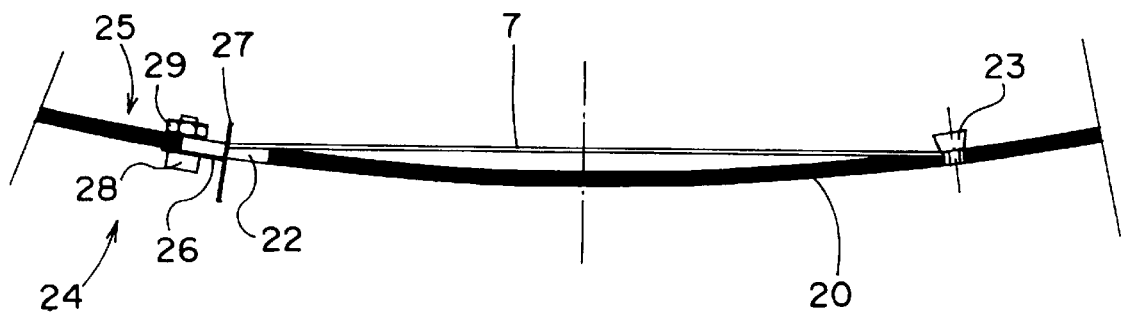
FIG. 5 shows, in the form of a cross-sectional view taken along line A–A' of FIG. 4, a location of a substrate in a support according to the present invention.

FIG. 5 is a partial cross-section taken along line A–A' of FIG. 4.

A characteristic of the present invention is that the wafer holding means are operable from the external surface 24 of support 20 whereas they act upon the wafers 7 from the inside surface 25 of the support. Each holding means associated with a location 21 is comprised of a spring 26 attached to the outside of the support, for example, by a bolt 28 extending through support 20 and by a nut 29. Spring 26 includes a tab 27 which enters the inside surface 25 through port 22 to bear against the edge of wafer 7.

Port 22 defines, along its length, the motion range of the tab 27. FIGS. 4 and 5 show that port 22 encroaches upon the location 21 to which it is associated to ensure that tab 27 bears against the edge of a wafer 7 engaged in location 21. Conversely, in the absence of a wafer 7 in location 21, tab 27 abuts against the longitudinal end of port 22 on the side of location 21. The length of port 22 must be sufficient, outside location 21, to enable a disengaging of tab 27 during the positioning or the unloading of a wafer 7.

Referring to FIG. 5, the stop(s) 23 practically do not mask the exposed surface of the wafer. They can however have a slightly tapered shape, as is shown, to ensure a better positioning and holding of the wafer against the stop(s) 23 by the spring 26.

Figure 6:
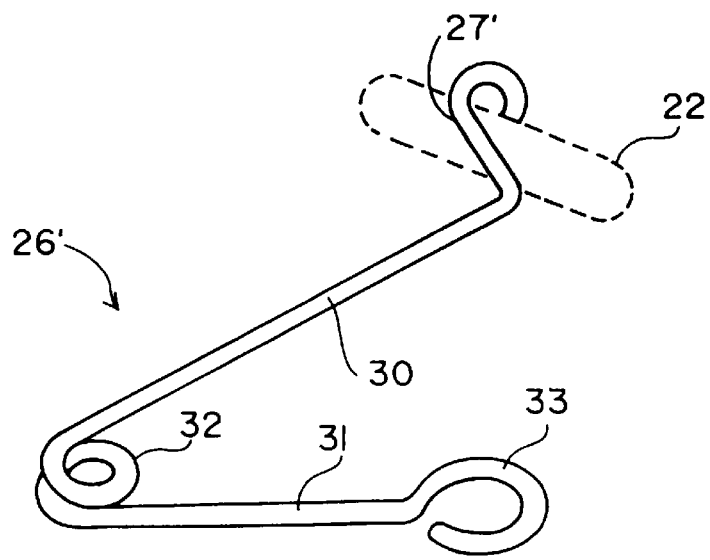
FIG. 6 shows, in perspective view, a first embodiment of a substrate holding means according to the present invention.
Figure 7:
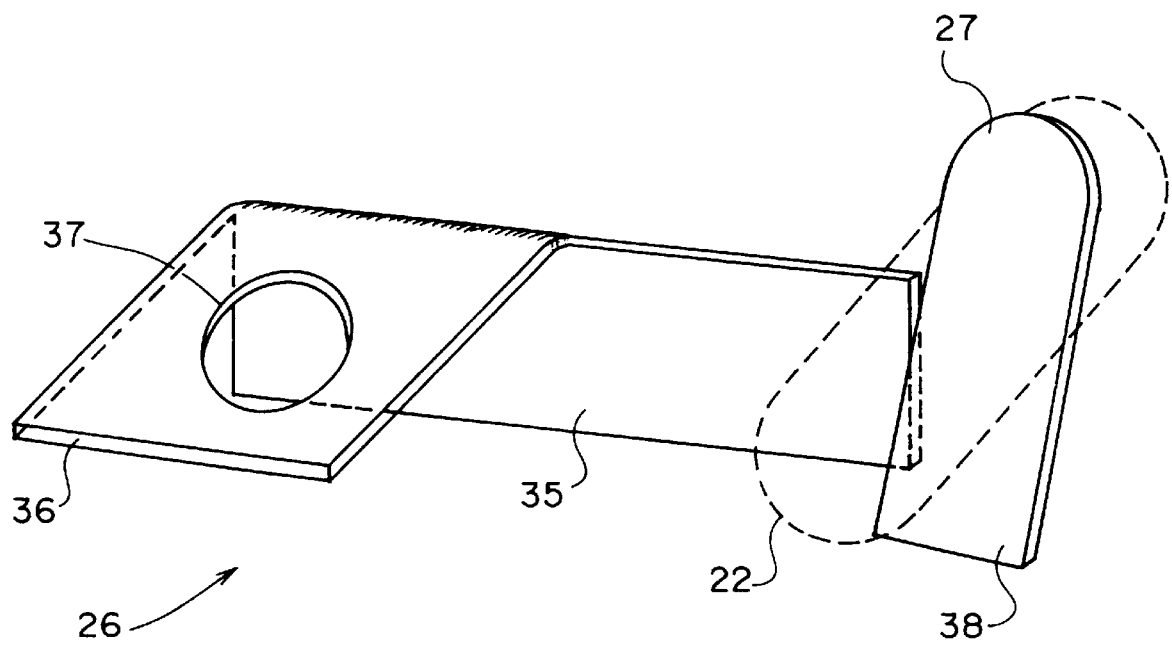
FIG. 7 shows, in perspective view, a second embodiment of a substrate holding means according to the present invention.

FIGS. 6 and 7 show two embodiments of a spring 26 for holding a wafer in its location. According to a first embodiment, shown in FIG. 6, each spring 26' is a hairpin spring, the two branches 30 and 31 of which are located outside support 20 (see FIG. 5) and are brought together by a loop 32 defining a housing for receiving a fastener, for example a bolt (not shown), to fasten spring 26' to support 20. The first branch 30, proximal to surface 24 (see FIG. 5), terminates with a tab 27' in a plane perpendicular to the planes defined by the motions of branches 30 and 31 when spring 26' is operated. Tab 27' extends through port 22 (shown in dotted lines in FIG. 6) and has, for example, the shape of a gooseneck. The second branch 31 constitutes a device for operating spring 26' and terminates, for example, with a ring 33 coplanar to the plane of branch 31.

According to a second embodiment, shown in FIG. 7, each spring 26 is a leaf spring. The spring 26 includes a leaf 35 on the outer side of support 20 (see FIG. 5). This leaf 35 terminates at a first end with a plate 36 having a hole 37 so that a bolt 28 (see FIG. 5) for fastening to support 20 can extend therethrough. Leaf 35 terminates at a second end with a tab 27 extending through a port 22 (shown in dotted lines in FIG. 7) of support 20. Tab 27 is in a plane parallel or slightly biased towards location 21 (FIG. 4) with respect to the plane of leaf 35, whereas plate 36 is in a plane perpendicular to leaf 35. The spring 26 is operated directly from leaf 35 or from an extension 38 symmetrical to tab 27 with respect to leaf 35.

An advantage of this second embodiment is that it enables tab 27 to bear against the edge of a wafer via a planar surface, which avoids any risk of damaging the wafer by chipping it as the spring releases. If the wafers have a non-perpendicular edge, which is often the case, the wafers are positioned by the user so that the cut edge receives the bearing surface of tab 27, which further improves the positioning and holding of the wafer.

The loading of a batch of wafers onto a support is performed as follows. The support is placed in a position where its inside surface 25 is accessible. Preferably, support 20 is mounted by means of its axis (A) on an adapted tool enabling it to rotate freely, so that the user can, as in the prior art, rotate support 20 as its loading or unloading proceeds. With one hand, the user operates a spring 26 or 26' by the bottom side of the support, and with the other hand, the user removes or lays a wafer from or in the corresponding location 21, for example, and conventionally, by means of a pipette, and once the wafer is positioned, the user releases the spring. Preferably, all springs are located substantially on a same side of the locations 21 distributed on the support to facilitate their access to the user. Unloading the wafers from the support is accomplished by performing the steps in the reverse order.

Although it is not absolutely necessary due to the immediate blocking of a wafer as soon as it has been positioned in the support, the locations 21 can be defined within inside surface 25 of support 20 by a slight recess (not shown) of this inside surface 25 in locations 21 in order to facilitate the proper positioning of the wafers.

The use of a support according to the present invention is thus particularly simple. The fact that the user acts individually and directly upon each spring enables checking, for each loading or unloading, the state of each spring.

An advantage of the present invention is that, since the support surface is substantially planar, it is now possible to make it thinner with no prejudice to its rigidity and/or to use materials with a smaller density than that of stainless steel, for example titanium.

Of course, the present invention is likely to have various alterations, modifications, and improvements which will readily occur to those skilled in the art, especially as concerns the distribution of the locations 21, of the ports 22 and of the stops 23 as well as that of springs 26 or 26' and their fasteners. Moreover, the practical implementation of springs 26 or 26', especially the selection of their stiffness according to wafer size, is within the abilities of those skilled in the art. Further, other fasteners can be provided instead of springs. It is, however, preferred to use a detachable means to facilitate the substitution of weak springs.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A concave substrate support, comprised of a substantially solid surface and provided with a plurality of resilient holding members, each for holding a substrate positioned against an inner surface of the support, the holding member being operable from beyond an outer surface of the support.

2. The substrate support according to claim 1 wherein each holding member of the substrate is operable individually.

3. The substrate support according to claim 1 wherein each holding member is comprised of a leaf spring having a first end and second end, the first end attached to an outer surface of the support and the second end supporting a tab for bearing against an outer edge of a substrate.

4. The substrate support according to claim 3 wherein the tab includes an extension directed away from a juncture where it contacts the substrate, the tab for operating the spring from beyond the outer surface of the support.

5. The substrate support according to claim 3 wherein each holding member is attached to the support from the outer surface and the tab extends through a port provided in the support in the vicinity of a location provided for the substrate.

6. The substrate support according to claim 5 wherein the inner surface of the support is provided with at least one stop for cooperating with the resilient holding member, the stop located substantially opposite to the port with respect to the center of the location.

7. The substrate support according to claim 3 further including a plurality of locations provided to support a respective substrate wherein each location is defined by a recess of the inner surface of the support.

8. The substrate support according to claim 1 wherein each holding member is comprised of a hairpin spring having a first branch and a second branch both located adjacent to an outer surface of the support, the first branch terminating, at a free end, with a tab extending through a port provided in the support in the vicinity of a location provided for the substrate, the second branch for operating the spring from beyond the outer surface of the support.

9. The substrate support according to claim 1 used to facilitate depositing metallic compounds on semiconductor components being manufactured on silicon wafers.

10. A device for evaporating materials on substrates, including one or more concave supports, each support comprised of a substantially solid surface and provided with a plurality of resilient holding members, each for holding a substrate positioned against an inner surface of the support, the holding member being operable from beyond an outer surface of the support.

11. A device for holding one or more wafers, comprising:

one or more supports each operable to hold a respective platter on which the wafers are placed, the platter having an inner side and an outer side;

a plurality of holes through the platter; and a plurality of clasps each positioned to secure a respective wafer against the inner side of the platter, each clasp operable from the outer side of the platter through a respective one of the holes.

12. The device of claim 1, further comprising:

one or more stop members attached to the inner side of the platter, each stop member for providing a stop for one of the wafers secured by a respective one of the clasps.

13. The device of claim 12 wherein the stop members are tapered.

14. The device of claim 11 wherein the inner and outer sides of the platter have a concave shape.

15. The device of claim 11 wherein the inner side of the platter has a plurality of recesses each for accepting one of the wafers.

16. The device of claim 11 wherein at least one clasp is made from a resilient material.

17. The device of claim 11 wherein at least one clasp is individually operable.

18. The device of claim 11 wherein at least one clasp further comprises:

a spring having a first branch and a second branch, the first branch terminating with a tab for contacting and securing one of the wafers, the second branch for operating the spring from the outer side of the platter.

19. The device of claim 11 wherein at least one clasp further comprises:

a leaf spring having a body and a tab, the body attached to the outer side of the platter, the tab for bearing against an outer edge of one of the wafers and securing it to the inner side of the platter.

20. The device of claim 19 wherein the tab extends through one of the holes and which is operable from the outer platter of the support.

* * * * *